| United States Patent [19] | [11] Patent Number: 4,585,511 |
| Bult et al. | [45] Date of Patent: Apr. 29, 1986 |

[54] METHOD OF GROWING GALLIUM ARSENIDE CRYSTALS USING BORON OXIDE ENCAPSULANT

[75] Inventors: Roelof P. Bult, Fruitvale; Ted E. Schroeder, Trail; James G. Needham, Rossland, all of Canada

[73] Assignee: Cominco Ltd., Vacouver, Canada

[21] Appl. No.: 516,030

[22] Filed: Jul. 22, 1983

[51] Int. Cl.⁴ ............................................. C30B 27/02
[52] U.S. Cl. ................................................... 156/607
[58] Field of Search .......... 156/607, 617 SP, DIG. 70, 156/DIG. 73, DIG. 89, DIG. 98

[56] References Cited

U.S. PATENT DOCUMENTS

| 3,070,467 | 12/1962 | Fuller et al. | 148/188 |
| 3,551,116 | 12/1970 | Woodall et al. | |
| 4,135,952 | 1/1979 | Anderson et al. | 148/189 |
| 4,299,650 | 11/1981 | Bonner | 156/617 SP |
| 4,312,681 | 1/1982 | Rupprecht et al. | 156/DIG. 73 |

FOREIGN PATENT DOCUMENTS 0092409 10/1983 European Pat. Off.

OTHER PUBLICATIONS

"Carbon in Semi-Insulating, Liquid Encapsulated Czochralski GaAs" Hunter et al., *App. Phys. Lett.* 44(1) 1/1/84.

AuCoin et al., "Liquid Encapsulating Compounding and Czochrolski Growth of Semi-Insulating Gallium Arsenide" *Solid State Technology* (Jan. 1979), pp. 59–62, 67.

*Primary Examiner*—Hiram H. Bernstein
*Attorney, Agent, or Firm*—Arne I. Fors; Robert F. Delbridge

[57] ABSTRACT

Gallium arsenide single crystals are grown under an encapsulant of boron oxide which contains a predetermined amount of water in the range of 200 to 1000 ppm. The GaAs crystals so produced are stable in that the resistivity of the GaAs upon heat treatment remains substantially constant. The GaAs single crystals as produced may be subjected to a bulk anneal to further improve the stability.

2 Claims, No Drawings

METHOD OF GROWING GALLIUM ARSENIDE CRYSTALS USING BORON OXIDE ENCAPSULANT

BACKGROUND OF THE INVENTION

This invention relates to a method for growing single crystals of gallium arsenide and, more particularly, to a method for growing semi-insulating single crystal gallium arsenide with improved physical characteristics using boron oxide encapsulant.

Gallium arsenide (GaAs) single crystals can be grown by any of a number of methods. Many of these methods use a liquid encapsulant, usually boron oxide ($B_2O_3$), to improve the quality of the single crystal GaAs. When grown under a layer of molten $B_2O_3$, the evaporation of the more volatile component of GaAs is better controlled, stoichiometry of the single crystal is improved and the impurity content of the GaAs is lowered.

It is generally acknowledged in the industry, as witnessed by the published literature, that it is essential that the $B_2O_3$ must be substantially anhydrous in order to provide the above recited improvements. For instance, it has been stated that "it is essential to remove traces of water from the boron oxide" (J. Phys. and Chem. Solidsm 26, 4, 782 (1965). Similar statements have been made during the 1966 Symposium on GaAs (Chemical Abstracts 69, 46579 y), in the J. Crystal Growth, 3, 4, 281 (1968), in the Mat. Resources Bull., 6, 1297 (1971) and in the J. Electr. Matl., 4, 2, 389 (1975). The water content of $B_2O_3$ is generally lowered by subjecting the $B_2O_3$ to vacuum baking for a period of time at temperatures as high as 1100° C. In spite of the special treatment of $B_2O_3$ to reduce its water content, the water content of $B_2O_3$ used in crystal growth is not entirely eliminated and may range from substantially anhydrous, i.e. less than 100 ppm, to as high as 1000 ppm. This residual water content of $B_2O_3$ has a distinct effect on the physical properties of GaAs.

It is desirable that semi-insulating GaAs crystal material has physical properties which do not cause instability. It is particularly desirable that such GaAs has a resistivity which does not decrease when the material, in the form of wafers, is subjected to a heat treatment to obtain suitable characteristics for electronic devices on the GaAs. Some GaAs material shows a decrease in resistivity upon heat treatment, while other GaAs material shows an increase in resistivity or possesses a constant resistivity, the latter material being the preferred material.

SUMMARY OF THE INVENTION

It has now been found that the resistivity of semi-insulating GaAs single crystal material is related to the water content of the $B_2O_3$ encapsulant. More particularly, it has been surprisingly found that, contrary to prior art teachings, the use of $B_2O_3$ with a very low water content in the growth of semi-insulating single crystal GaAs yields GaAs unsuitable for application in electronic devices. More specifically, such very low water content yields GaAs which has a resistivity which decreases when such GaAs is submitted to a heat treatment. It has also been found that the use of $B_2O_3$ with a slightly higher, predetermined water content yields GaAs which has a resistivity which does not decrease when GaAs is subjected to a heat treatment. It has furthermore been found that, when semi-insulating GaAs single crystals grown under $B_2O_3$ having slightly higher, predetermined water contents are subjected to a bulk annealing operation of the crystals as grown, the GaAs becomes homogenized in that its resistivity has obtained the desired values even when subjected, in the form of wafers, to a second heat treatment.

Accordingly, there is provided in the method of producing semi-insulating single crystal GaAs by growth from a melt covered with a layer of boron oxide as encapsulant, the improvement which comprises covering the melt with boron oxide which contains water in an amount in the range of about 200 to 1000 ppm, and recovering semi-insulating single crystal GaAs, which single crystal GaAs has a resistivity in the range of about $5 \times 10^5$ to $2 \times 10^8$ ohm cm.

According to a second embodiment, there is provided in the method of producing semi-insulating GaAs single crystals by growth from a melt covered with a layer of boron oxide as encapsulant, the improvement which comprises covering the melt with boron oxide which contains water in an amount in the range of about 200 to 1000 ppm and bulk annealing the GaAs single crystals so produced at a temperature in the range of about 750° to 900° C. for a period of time in the range of about 30 to 120 minutes whereby the bulk annealed GaAs single crystals so produced are stable and have a resistivity in the range of about $5 \times 10^5$ to $2 \times 10^8$ ohm cm.

Preferably, the boron oxide contains water in an amount in the range of about 250 to 600 ppm.

The GaAs crystals produced according to the first and second embodiments may be cut into wafers and the wafers subjected to a heat treatment at a temperature in the range of about 750° to 900° C. for a period of time in the range of about 30 to 120 minutes in a hydrogen atmosphere, whereby the ratio between the resistivity of the GaAs wafers before said heat treatment and the resistivity after the heat treatment is in the range of about 0.8:1.0 to 1.2:1.0. Preferably, the ratio is about unity and the resistivity of the GaAs crystals produced according to the first and second embodiments is in the range of about $1 \times 10^6$ to $7 \times 10^7$ ohm cm.

It is a principal object of the present invention to produce GaAs single crystal material with improved physical characteristics.

Another object of the invention is to provide a method of growing GaAs single crystal material which retains its resistivity value upon heat treatment.

It is a further object of the invention to grow GaAs single crystals under a boron oxide encapsulant containing a predetermined amount of water.

It is yet a further object of the invention to subject GaAs single crystals as grown to a bulk-annealing operation to make stable, more homogeneous GaAs material.

These and other objects of the invention and the manner in which they can be attained will become apparent from the following detailed description.

DETAILED DESCRIPTION

The method of the present invention is suitable for the growth of semi-insulating single crystal GaAs using an encapsulant and, particularly, for the growth of single crystal GaAs using the Liquid-Encapsula-ted Czochralski (LEC) method employing $B_2O_3$ as the encapsulant. Although the invention is specifically described with reference to GaAs grown by the LEC method, it is to be understood that the method according to the invention is equally applicable to the manufacture of other semi-conductor compounds single crystals such GaP, InP, CaTe, CdS, ZnSe and ZnS, and to other methods used for preparing GaAs and other semi-conductor compound single crystal material using $B_2O_3$ encapsulant.

In the LEC method, a GaAs seed crystal is dipped into a melt of gallium and arsenic in the desired amounts and preferably contained in a boron nitride crucible, and the seed crystal is slowly raised to form a GaAs single crystal which is raised along with the seed crystal. The method can be carried out, for example, in a Melbourn Crystal Puller (Trade Mark) sold by Cambridge Instruments Ltd., U.K. The melt is covered with a layer of molten $B_2O_3$. The single crystal of GaAs as grown is subsequently sliced into wafers which are then heat treated to provide the desired electrical characteristics required for application in electronic devices.

The electrical characteristics of the material are critical to device operation, particularly in relation to stability, reproducibility and uniformity. A measure of the electrical characteristics of the semi-insulating GaAs is the resistivity. It is noted that a large change in resistivity observed in the heat treatment of GaAs wafers is a surface effect rather than a bulk effect. The resistivity should preferably have the same value before and after or an increased value after the heat treatment step. "Undoped" GaAs single crystal material with a resistivity below about $2 \times 10^8$ ohm cm and especially below about $7 \times 10^7$ ohm cm remains stable or shows an increase in resistivity after a heat treatment of wafers at temperatures in the range of about 750° to 900° C. for a time period in the range of about 30 to 120 minutes in a hydrogen atmosphere. It is to be understood that other heat treatment procedures, such as those at higher temperatures and for shorter periods of time, e.g. flash annealing, are equally suitable, provided that such procedures provide adequate protection of the surface of the GaAs to prevent contamination, or loss of stoichiometry. In contrast, material with a resistivity above about $2 \times 10^8$ ohm cm is unstable and shows a decrease in resistivity when heat treated as described. For example, undoped GaAs single crystal material with a resistivity of $3 \times 10^8$ ohm cm had a resistivity of only $1 \times 10^5$ ohm cm after heat treatment. This material was unsuitable for application in electronic devices.

It has been discovered that undoped GaAs possessing high resistivities, i.e. above about $2 \times 10^8$ ohm cm, is obtained when the GaAs single crystal is pulled from a melt by the LEC method when the $B_2O_3$ encapsulant contains less than about 200 ppm water.

The resistivity of such GaAs decreases upon heat treatment as described and the GaAs is consequently considered to be unstable. When the GaAs crystal is grown under $B_2O_3$ containing about 200 to 250 ppm water, the resistivity of the GaAs upon heat treatment as described decreases only slightly and in some cases remains constant. When the GaAs crystal is grown under $B_2O_3$ containing water in the range of about 250 to 1000 ppm, preferably about 250 to 600 ppm, the GaAs is stable and has a resistivity which remains constant or increases upon heat treatment as described. The desirable values for the resistivity of gaAs single crystal material are in the range of about $5 \times 10^5$ to $2 \times 10^8$ ohm cm, preferably about $1 \times 10^6$ to $7 \times 10^7$ ohm cm.

The resistivity values of undoped as-grown GaAs single crystals by the LEC method under $B_2O_3$, which has a water content of more than 200 ppm and less than about 1000 ppm, varies with the water content, and are less than $2 \times 10^8$ ohm cm and usually in the range of about $1 \times 10^5$ to $2 \times 10^8$ ohm cm.

It has been found that when the undoped as-grown GaAs crystals grown under $B_2O_3$ having water contents in the preferred range are subjected to a bulk anneal, the GaAs having bulk resistivity values prior to the anneal in the lower end of the range of $1 \times 10^5$ to $2 \times 10^8$ ohm cm will show increased values for the bulk resistivity and the annealed GaAs is stable, more homogeneous and possesses bulk resistivities in the desired range of about $1 \times 10^6$ to $7 \times 10^7$ ohm cm.

The bulk anneal is carried out by heating the undoped as-grown GaAs single crystal in a furnace to a temperature in the range of about 750° to 900° C. for a period of time in the range of about 30 to 120 minutes and cooling the annealed crystal. If desired, the bulk-annealed GaAs crystals may be cut into wafers and the wafers subjected to a heat treatment as described. The GaAs material which has been bulk annealed and heat treated has a ratio between the resistivity of the GaAs wafer before the heat treatment and the resistivity of the GaAs wafer after the heat treatment in the range of about 0.8:1 to 1.2:1. The resistivity ratio is preferably about unity. As noted before, the changes in resistivity observed in heat treatment of "unstable" GaAs wafers are a surface rather than a bulk effect. Therefore, the resistivity of the heat treated wafers may show a small increase or decrease compared to the value of the bulk resistivity of the as-grown GaAs. The heat treatment of the wafers of bulk-annealed GaAs yields resistivity values in the desired range of about $1 \times 10^6$ to $7 \times 10^7$ ohm cm, which values are substantially the same as the bulk resistivity values of the bulk-annealed GaAs single crystal.

The use of $B_2O_3$ with a predetermined water content in the range of about 200 to 1000 ppm in combination with a bulk anneal of the undoped as-grown GaAs single crystals is an excellent means to produce more homogeneous GaAs single crystals, to control the physical characteristics of GaAs single crystal material and to yield a GaAs material which is eminently suitable for use in electronic devices.

The invention will now be illustrated by the following non-limitative examples.

EXAMPLE 1

Using a Melbourn Crystal Puller (Trade Mark), a number of single crystals of GaAs were grown from a melt consisting of 69 grade Ga and 69 grade As. In each growth test, the melt was covered with a layer of molten $B_2O_3$ containing a different amount of water. The undoped single crystal obtained from each test was cut into wafers and a wafer from the top section of the crystal and one from the bottom section were heat treated at 850° C. for 30 minutes in a hydrogen atmosphere. The resistivity of the wafers was measured by the van der Pauw technique before and after the heat treatment. The water contents of the $B_2O_3$ and the measured resistivities are given in Table I.

TABLE I

| Test No. | $B_2O_3$ $H_2O$ in ppm | Resistivities in ohm cm | | | |
|---|---|---|---|---|---|
| | | Top Sample | | Bottom Sample | |
| | | Before | After | Before | After |
| 1 | 164 | $5.7 \times 10^8$ | $4.6 \times 10^3$ | $6.4 \times 10^7$ | $1.9 \times 10^4$ |
| 2 | 164 | $4.8 \times 10^8$ | $7.5 \times 10^4$ | $7.0 \times 10^7$ | $1.3 \times 10^6$ |
| 3 | 192 | $1.4 \times 10^8$ | $1.0 \times 10^4$ | $4.1 \times 10^7$ | $1.0 \times 10^6$ |

TABLE I-continued

| Test No. | $B_2O_3$ $H_2O$ in ppm | Resistivities in ohm cm | | | |
|---|---|---|---|---|---|
| | | Top Sample | | Bottom Sample | |
| | | Before | After | Before | After |
| 4 | 460 | $6.5 \times 10^6$ | $1.9 \times 10^7$ | $9.7 \times 10^6$ | $2.6 \times 10^7$ |
| 5 | 460 | $6.0 \times 10^6$ | $3.8 \times 10^7$ | $2.3 \times 10^6$ | $1.2 \times 10^7$ |
| 6 | 460 | $5.5 \times 10^6$ | $2.1 \times 10^7$ | $7.8 \times 10^6$ | $1.3 \times 10^7$ |
| 7 | 460 | $4.2 \times 10^6$ | $2.2 \times 10^7$ | $3.6 \times 10^6$ | $2.0 \times 10^7$ |
| 8 | 1000 | $1.2 \times 10^7$ | $8.7 \times 10^6$ | — | — |

The tabulated test results show that a water content of the $B_2O_3$ below 200 ppm gives resistivities which decrease at least an order of magnitude upon heat treatment of wafers cut from the single crystal and that a water content of $B_2O_3$ between 200 and 1000 ppm gives resistivities which remain substantially constant or which increase somewhat upon heat treatment of wafers. The resistivities of the material grown under $B_2O_3$ with 200–1000 ppm water are in the desired range of $1 \times 10^6$ to $7 \times 10^7$.

EXAMPLE 2

Using a Melbourn Crystal Puller (Trade Mark), a single crystal of GaAs was grown from a melt consisting of 69 grade Ga and 69 grade As. The melt was covered with molten $B_2O_3$ containing an amount of water in the preferred range. The undoped as-grown single crystal was subjected to a bulk anneal by placing the crystal in a furnace, heating the furnace to 850° C., maintaining the temperature at 850° C. for one hour and cooling the crystal to room temperature. The top and bottom portions of the crystal were sampled before and after bulk annealing of the crystal and the resistivity determined using the van der Pauw technique. The water content of the $B_2O_3$ and the measured resistivities are given in Table II.

TABLE II

| Test No. | $B_2O_3$ $H_2O$ in ppm | Bulk Resistivities in ohm cm | | | |
|---|---|---|---|---|---|
| | | Top Sample | | Bottom Sample | |
| | | Before | After | Before | After |
| 9 | 340 | $8.9 \times 10^5$ | $5.9 \times 10^7$ | $2.4 \times 10^7$ | $6.4 \times 10^7$ |

The results show that bulk annealing of as-grown GaAs single crystals increases the resistivity and produces a more homogeneous crystal. The results also show that bulk annealing results in resistivities in the desired range of $1 \times 10^6$ to $7 \times 10^7$ ohm cm.

EXAMPLE 3

A wafer was cut from the top portion of the bulk-annealed crystal obtained in test No. 9 and the wafer was subjected to a heat treatment of 850° C. for 30 minutes in a hydrogen atmosphere. The resistivity of the heat-treated wafer was measured at $7.3 \times 10^7$ ohm cm. The ratio between resistivities measured before and after the heat treatment was 1.2. The results show that the resistivity of heat treated wafers cut from a bulk-annealed GaAs single crystal has a substantially constant value within the desired range of about $1 \times 10^6$ to $7 \times 10^7$ ohm cm.

It should be understood that the invention is capable of further modifications and variations without departing from the scope and purview of the attached claims.

What we claim as new and desire to protect by Letters Patent of the United States is:

1. In the method of producing undoped semi-insulating GaAs single crystals by growth from a melt covered with a laer of boron oxide as encapsulant, the improvement which comprises covering the melt with boron oxide which contains water in a predetermined amount in the range of about 250 to 600 ppm, bulk annealing the GaAs single crystals at a temperature in the range of about 750° to 900° C. for a period of time in the range of about 30 to 120 minutes, whereby the uniformity of the bulk annealed crystals with respect to the electrical characteristics is improved and whereby the GaAs single crystals so produced are stable and have a resistivity in the range of about $1 \times 10^6$ to $7 \times 10^7$ ohm cm, which resistivity does not decrease upon heat treatment of wafers cut from GaAs crystals so produced, said heat treatment being carried out at 750° to 900° C. for 30 to 120 minutes in a hydrogen atmosphere, the ratio between the resistivity of the GaAs wafers before and after said heat treatment being in the range of about 0.8:1.0 to 1.2:1.0.

2. The improvement as claimed in claim 1, wherein the said ratio is about unity.

* * * * *